US 11,187,734 B2

(12) United States Patent
Karlgaard et al.

(10) Patent No.: US 11,187,734 B2
(45) Date of Patent: Nov. 30, 2021

(54) SYSTEMS FOR ELECTRICALLY CONNECTING METERING DEVICES AND DISTRIBUTED ENERGY RESOURCE DEVICES

(71) Applicant: Landis+Gyr Innovations, Inc., Alpharetta, GA (US)

(72) Inventors: Matt Karlgaard, Brainerd, MN (US); John Radgowski, Midlothian, VA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 0 days.

(21) Appl. No.: 16/428,118

(22) Filed: May 31, 2019

(65) Prior Publication Data

US 2020/0379021 A1    Dec. 3, 2020

(51) Int. Cl.
  *G01R 22/06*  (2006.01)
  *H01R 33/94*  (2006.01)
  *H01R 33/945*  (2006.01)

(52) U.S. Cl.
  CPC ........... *G01R 22/061* (2013.01); *H01R 33/94* (2013.01); *H01R 33/945* (2013.01); *H01R 2201/20* (2013.01)

(58) Field of Classification Search
  CPC .... G01R 22/061; H01R 33/94; H01R 33/945; H01R 24/542; H01R 9/2491; H01R 2201/20; H02J 3/386; H02S 40/34
  See application file for complete search history.

(56) References Cited

U.S. PATENT DOCUMENTS 4,463,311 A     7/1984  Kobayashi
4,977,482 A  *  12/1990 Langdon ................ G01R 11/04
                                                    324/156

(Continued)

FOREIGN PATENT DOCUMENTS

CN         1403825       3/2003
CN       201467023       5/2010

(Continued)

OTHER PUBLICATIONS

Unpublished U.S. Appl. No. 16/793,876, filed Feb. 18, 2020.

(Continued)

*Primary Examiner* — Patrick Assouad
*Assistant Examiner* — Demetrius R Pretlow
(74) *Attorney, Agent, or Firm* — Kilpatrick Townsend & Stockton LLP

(57) ABSTRACT

A meter collar includes a connection path to form an electrical connection between a distributed energy resource (DER) meter and line voltage wirings of an electric distribution system and a second connection path to form an electrical connection between the DER meter and neutral wires of the electric distribution system, a DER device, and a load. Further, the meter collar includes a third connection path within the meter collar to form an electrical connection between the DER meter and output voltage wirings of the DER device. Furthermore, the meter collar includes mating connectors electrically connected to a first end of a corresponding connection path to accept mating connectors of the DER meter. The meter collar also includes mating connectors electrically connected to a second end of the corresponding connection path to mate with the line voltage wirings, the neutral wires, and the output voltage wirings.

20 Claims, 3 Drawing Sheets

(56) References Cited

U.S. PATENT DOCUMENTS

| | | | |
|---|---|---|---|
| 5,572,396 A * | 11/1996 | Robinson | G01R 1/36 361/117 |
| 6,188,145 B1 * | 2/2001 | Stewart | H02J 7/007 307/125 |
| 6,420,801 B1 | 7/2002 | Seefeldt | |
| 7,274,305 B1 * | 9/2007 | Luttrell | B61L 1/20 324/141 |
| 7,298,134 B2 | 11/2007 | Weikel | G01R 21/133 324/142 |
| 7,648,389 B1 * | 1/2010 | Scott | H01R 9/2491 439/517 |
| 8,049,642 B2 | 11/2011 | Makinson et al. | |
| 8,207,865 B2 | 6/2012 | Kopp et al. | |
| 8,212,687 B2 | 7/2012 | Makinson et al. | |
| 8,784,130 B2 | 7/2014 | Scott et al. | |
| 9,088,182 B2 | 7/2015 | Kuniyosi et al. | |
| 9,318,861 B2 | 4/2016 | Fulton et al. | |
| 9,391,414 B2 * | 7/2016 | Seals | H01R 31/065 |
| 9,437,986 B2 | 9/2016 | Knauer et al. | |
| 9,484,653 B1 | 11/2016 | Chen | |
| 9,500,672 B1 | 11/2016 | Hurst et al. | |
| 9,595,815 B2 | 3/2017 | Knauer et al. | |
| 9,620,305 B2 * | 4/2017 | Miller | H01H 9/54 |
| 9,627,861 B2 * | 4/2017 | Cruz | G01R 22/065 |
| 9,960,637 B2 | 5/2018 | Sanders et al. | |
| 9,995,768 B2 * | 6/2018 | Parks | G01R 3/00 |
| 10,132,838 B2 * | 11/2018 | Parks | G06Q 50/06 |
| 2002/0075622 A1 * | 6/2002 | Robinson | H02B 1/03 361/117 |
| 2002/0171436 A1 | 11/2002 | Russell | |
| 2003/0034693 A1 * | 2/2003 | Wareham | H02J 9/066 307/23 |
| 2004/0036362 A1 * | 2/2004 | Beck | H01H 21/42 307/125 |
| 2005/0027464 A1 * | 2/2005 | Jonker | G01R 21/133 702/61 |
| 2008/0091625 A1 | 4/2008 | Kremen | |
| 2009/0121705 A1 * | 5/2009 | Rzehak | G01R 22/10 324/142 |
| 2010/0003848 A1 * | 1/2010 | Scott | H01R 9/2491 439/517 |
| 2010/0105226 A1 | 4/2010 | Gong et al. | |
| 2010/0225305 A1 * | 9/2010 | Reineccius | G01R 22/06 324/126 |
| 2010/0306027 A1 | 12/2010 | Haugh | |
| 2013/0106397 A1 | 5/2013 | Fulton et al. | |
| 2013/0123997 A1 | 5/2013 | King et al. | |
| 2013/0211754 A1 | 8/2013 | Herzog et al. | |
| 2013/0226485 A1 * | 8/2013 | Pietrowicz | H04L 43/028 702/62 |
| 2014/0127935 A1 | 5/2014 | Scott et al. | |
| 2014/0218010 A1 * | 8/2014 | Fulton | H01R 33/90 324/110 |
| 2015/0061644 A1 | 3/2015 | Parks et al. | |
| 2015/0233980 A1 | 8/2015 | Umetsu et al. | |
| 2015/0285844 A1 * | 10/2015 | May | G01R 22/061 324/127 |
| 2015/0309075 A1 * | 10/2015 | Parks | H01R 33/94 324/126 |
| 2016/0056571 A1 | 2/2016 | Hamaoka et al. | |
| 2016/0061870 A1 * | 3/2016 | Vaculik | G01R 21/06 702/106 |
| 2016/0141784 A1 | 5/2016 | Hashiguchi | |
| 2016/0181752 A1 | 6/2016 | Parks et al. | |
| 2016/0320427 A1 * | 11/2016 | Bautista | G01R 1/0416 |
| 2016/0380413 A1 * | 12/2016 | Cruz | H02H 7/22 361/668 |
| 2017/0168516 A1 | 6/2017 | King | |
| 2017/0194792 A1 | 7/2017 | Zimmanck et al. | |
| 2017/0212160 A1 | 7/2017 | Fulton et al. | |
| 2017/0214225 A1 * | 7/2017 | Ramachandran | H01R 31/06 |
| 2017/0229827 A1 | 8/2017 | Michelmann et al. | |
| 2017/0346296 A1 | 11/2017 | Schamber et al. | |
| 2018/0083446 A1 | 3/2018 | Kern | |
| 2018/0109047 A1 | 4/2018 | Hoang et al. | |
| 2018/0246150 A1 * | 8/2018 | Cook | G01R 15/16 |
| 2020/0225263 A1 | 7/2020 | Karlgaard | |

FOREIGN PATENT DOCUMENTS

| | | |
|---|---|---|
| CN | 201623651 | 11/2010 |
| CN | 10976854 | 2/2011 |
| CN | 103138291 | 6/2013 |
| CN | 103187735 | 7/2013 |
| CN | 105242087 | 1/2016 |
| CN | 103645363 | 9/2016 |
| FR | 3002642 | 8/2014 |
| JP | 06153527 | 5/1994 |
| JP | 2001090296 | 4/2001 |
| JP | 2011204045 | 10/2011 |
| JP | 2012228043 | 11/2012 |
| JP | 2012244665 | 12/2012 |
| JP | 2014230454 | 12/2014 |
| WO | 03014748 | 2/2003 |
| WO | 2003014748 | 3/2003 |
| WO | 2011124657 | 10/2011 |
| WO | 2013057516 | 12/2013 |
| WO | 2014002798 | 1/2014 |
| WO | 2014192015 | 12/2014 |
| WO | 2016167722 | 10/2016 |
| WO | 2017205724 | 11/2017 |

OTHER PUBLICATIONS

International Patent Application No. PCT/US2017/034653, "International Search Report and Written Opinion", dated Aug. 10, 2017, 12 pages.

International Patent Application No. PCT/US2017/034653, "International Preliminary Report on Patentability", dated Dec. 6, 2018, 8 pages.

Unpublished U.S. Appl. No. 16/244,701, filed Jan. 10, 2019.

"Conzerv EM6438_EM6436 Dual Source Energy Meters User Manual", available online at https://download.schneider-electric.com/files?p_enDocType=User+guide&p_File_Name=NHA12537-03.pdf&p%20Doc%20Ref=NHA12537, Dec. 31, 2015, 76 pages.

International Patent Application No. PCT/US2020/035312, International Search Report and Written Opinion, dated Sep. 14, 2020, 11 pages.

Milbank Manufacturing, "Recreational Vehicle Park", Product Sheet available at https://www.milbankworks.com/getmedia/24191e24-6c65-4ffb-a468-9c98e6ec6f68/Recreational-Vehicle-Park-Electrical-Products.pdf at least as early as Apr. 2019, 32 pages.

* cited by examiner

SYSTEMS FOR ELECTRICALLY CONNECTING METERING DEVICES AND DISTRIBUTED ENERGY RESOURCE DEVICES

TECHNICAL FIELD

This disclosure relates generally to systems for electrically connecting metering devices with distributed energy resource devices. More particularly this disclosure relates to establishing an electrical connection between a distributed energy resource (DER) meter, a DER device, and a meter socket using a DER collar electrically coupled between the DER meter and the DER device and the meter socket.

BACKGROUND

Distributed energy resource (DER) devices, for example, solar panels, wind turbines, electric vehicle batteries, etc. are typically wired into the grid with a connection into a circuit breaker in an electrical panel within a customer's premises. If metering of the DER device is required, a separate meter is mounted on the customer's wall for this purpose. One or more disconnect switches are also mounted on the customer's wall.

DER meters designed to meter electricity from the DER device and meter electricity from the grid may require a non-standard meter socket at the customer's premises to receive electrical inputs from both the grid and the DER device. The non-standard socket for the DER meters may require an invasive installation process at the customer's premises and may include a complicated and unaesthetic solution attached on the side of a wall, for example, at the customer's residence.

SUMMARY

Systems for connecting distributed energy resource devices with distributed energy resource meters are provided.

According to various aspects of the present disclosure there is provided an electric meter collar. The electric meter collar includes at least one first connection path within the electric meter collar to form an electrical connection between a distributed energy resource (DER) meter and line voltage wirings in a socket of an electric distribution system. Additionally, the electric meter collar includes at least one second connection path within the electric meter collar to form an electrical connection between the DER meter and neutral wires of the electric distribution system, a DER device, and a load. Further, the electric meter collar includes at least one third connection path within the electric meter collar configured to form an electrical connection between the DER meter and output voltage wirings of the DER device. Furthermore, the electric meter collar includes a first plurality of mating connectors, where each of the first plurality of mating connectors are electrically connected to a first end of a corresponding connection path and are configured to accept a second plurality of mating connectors of the DER meter. The meter collar also includes a third plurality of mating connectors, where each of the third plurality of mating connectors are electrically connected to a second end of the corresponding connection path and are configured to mate with the line voltage wirings, the neutral wires, and the output voltage wirings.

In another example, a system includes an electric meter and an electric meter collar that mates with the electric meter. The electric meter collar includes at least one first connection path within the electric meter collar to form an electrical connection between the electric meter and line voltage wirings in a socket of an electric distribution system. The electric meter collar also includes at least one second connection path within the electric meter collar to form an electrical connection between the electric meter and neutral wires in the socket of the electric distribution system. Further, the electric meter collar includes at least one third connection path within the electric meter collar to form an electrical connection between the electric meter and output voltage wirings of a distributed energy resource (DER) device. The electric meter collar also includes a first plurality of mating connectors, where each of the first plurality of mating connectors are electrically connected to a first end of a corresponding connection path and are configured to accept an additional mating connector of the electrical meter. Moreover, the electric meter collar includes a second plurality of mating connectors, where each of the second plurality of mating connectors are electrically connected to a second end of the corresponding connection path and are configured to mate with the line voltage wirings, the neutral wires, or the output voltage wirings.

In another example, a system for connecting and metering distributed energy resource devices includes an electric meter, an electric meter socket electrically coupled to an electric distribution system, and an electric meter collar to electrically couple the electric meter with the electric meter socket. The electric meter collar includes at least one first connection path within the electric meter collar to form electrical connections between the electric meter and line voltage wirings in the electric meter socket. The electric meter collar also includes at least one second connection path within the electric meter collar to form an electrical connection between the electric meter and neutral wires of the electric distribution system, a distributed energy resource (DER) device, and a load. Further, the electric meter collar includes at least one third connection path within the electric meter collar to form electrical connections between the electric meter and output voltage wirings of the DER device. Furthermore, the electric meter collar includes at least one fourth connection path within the electric meter collar to form an electrical connection between the electric meter and the load. The electric meter collar also includes a first plurality of mating connectors, where each of the first plurality of mating connectors are electrically connected to a first end of a corresponding connection path and are configured to accept an additional mating connector of the electric meter. Moreover, the electric meter collar includes a second plurality of mating connectors, where each of the second plurality of mating connectors are electrically connected to a second end of the corresponding connection path and are configured to mate with the line voltage wirings, the neutral wires, the output voltage wirings, or the load.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE DRAWINGS

Aspects and features of the various embodiments will be more apparent by describing examples with reference to the accompanying drawings, in which.

DETAILED DESCRIPTION

While certain examples are described herein, these examples are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Systems are provided for connecting distributed energy resource devices with metering devices. Currently there is no standard method for connecting distributed energy resources (DER) devices to the grid. Existing methods are often complicated and present an unaesthetic solution attached on the side of a wall, for example at a customer's residence. A DER collar is described herein that provides a mechanism to connect a DER meter with a conventional meter socket at a customer premises and with a DER device at the customer premises. For the purpose of this disclosure, a DER device is defined as any resource on an electric distribution system (i.e., a grid) that produces or stores electricity that can be provided to the distribution system, or any large load device that can be controlled to manage overall peak load of the distribution system. For example, the DER device may be a residential solar installation or a residential wind turbine installation, with or without local battery storage. Various aspects of the present disclosure provide a simple, aesthetic mechanism to connect a DER device to the electric distribution system using the conventional meter socket, a DER collar, and a DER meter.

Figure 1:
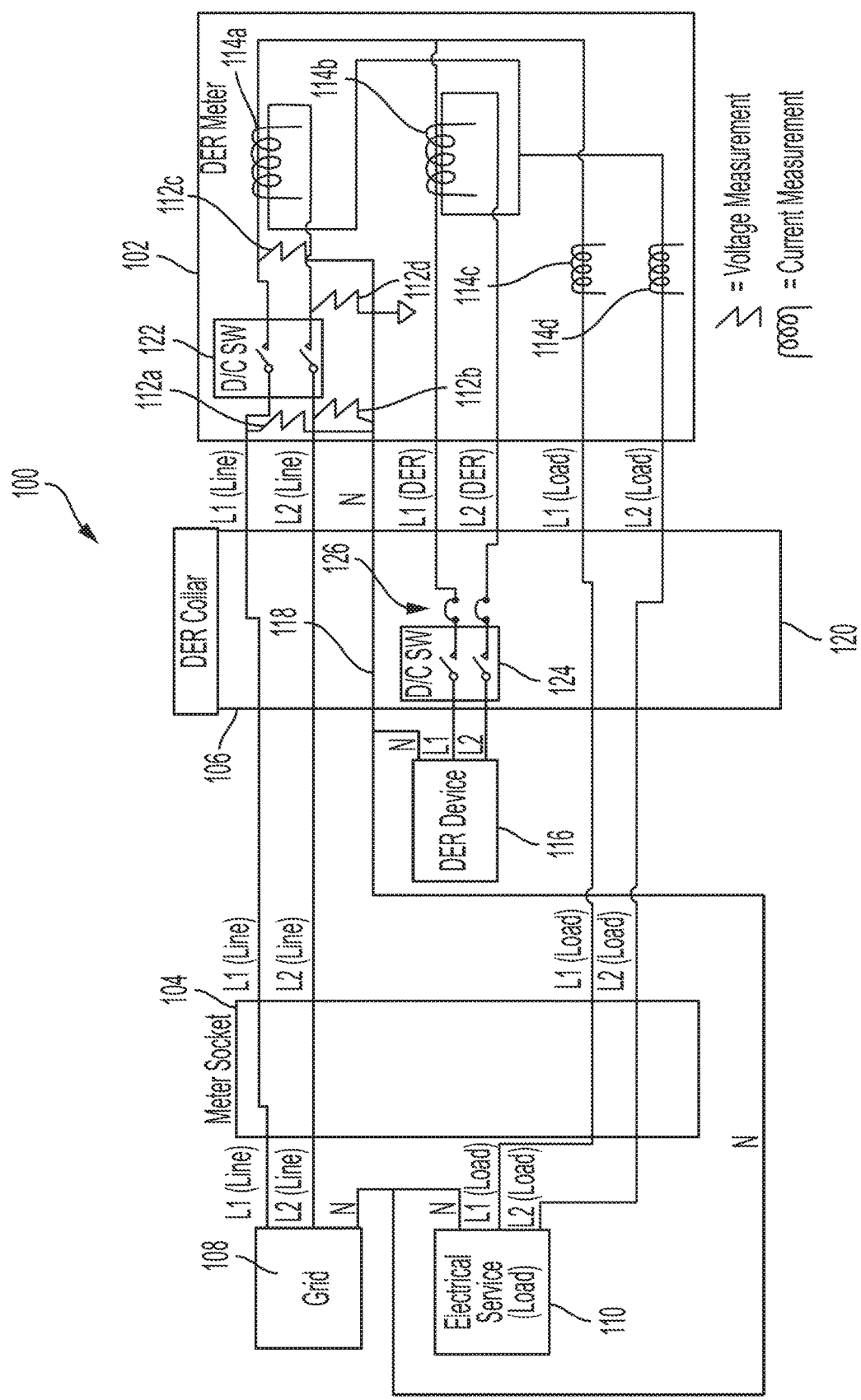
FIG. 1 is a block diagram illustrating electrical connections between a distributed energy resource (DER) meter and a meter socket using a DER collar according to various aspects of the present disclosure.

FIG. 1 is a block diagram 100 illustrating electrical connections between a distributed energy resource (DER) meter 102 and a meter socket 104 using a DER collar 106. The DER meter 102, the meter socket 104, and the DER collar 106 are located at a customer premises (e.g., a residential building, a commercial building, etc.). The DER meter 102 measures and controls electricity delivered to the customer premises via an electric distribution system (i.e., a grid 108) and electricity generated or otherwise stored at the customer premises via a DER device (i.e., a DER device 116). Accordingly, the DER meter 102 includes sufficient connection points to receive electricity provided from the grid 108, to receive electricity provided from the DER device 116, and to provide electricity to an electrical service 110.

The DER meter 102 may be combined with a communications module to enable the DER meter 102 to communicate with other meters and with a utility. As illustrated in FIG. 1, power from the grid 108 (i.e., the electric distribution system) is supplied to the meter socket 104 through electrical wiring L1 (Line) and L2 (Line). Electrical wiring L1 (Line) and L2 (Line) may provide power from two phases of the grid 108. A neutral wire N, sometimes referred to as ground, is connected between the grid 108 and an electrical service 110, for example, at an electrical service panel at a residential or commercial customer premises.

The electrical service or load 110 is also connected to the meter socket 104 via corresponding electrical wiring L1 (Load) and L2 (Load). The meter socket 104 may be a standard socket, such as a form 2S socket, that includes electrical connectors to provide electrical connections to a conventional meter when a conventional meter is plugged into the meter socket 104. An electrical connection between the grid 108 and the electrical service 110 is formed through the DER meter 102 and the DER collar 106 when the DER meter 102 is plugged into the DER collar 106 and the DER collar 106 is plugged into the meter socket 104. Within the DER meter 102, voltage and current provided by the grid 108 to the electrical service 110 is measured, or metered, by measuring devices. The measuring devices may be, for example, voltage transducers 112 and current transducers 114 that measure electrical characteristics of voltage and current waveforms, respectively. Power delivered to the electrical service 110 may be calculated based on the voltage and current measurements.

Output wirings from the DER device 116 may also be connected at connection points within the DER collar 106. A neutral wire N connection 118 may be formed at a connection point within the DER collar 106 to connect the neutral wires from the grid 108, the DER device 116, the electrical service 110, and the DER meter 102. In one or more examples, the connection points for the DER device 116 may be positioned on a side 120 of the DER collar 106. For example, the side 120 of the DER collar 106 may be any side of the DER collar 106 that does not interface with the meter socket 104 or the DER meter 102 (e.g., a side that is exposed while the DER collar 106 is coupled to the DER meter 102 and the meter socket 104). Positioning the connection points on the side 120 may provide an easily accessible location for the DER device 116 to connect with the DER collar 106.

The connection points within the DER collar 106 may provide electrical connections between the meter socket 104 and the DER meter 102. For example, the connection points for the lines L1 (Line) and L2 (Line) at the DER collar 106 from the grid 108 may electrically connect the lines L1 (Line) and L2 (Line) from the grid 108 to the DER meter 102. Similarly, the lines L1 and L2 from the DER device 116 and the lines L1 (Load) and L2 (Load) to the electrical service 110 may be electrically connected to the DER meter 102 through the connection points within the DER collar 106. Similar to the lines L1 (Line) and L2 (Line) from the grid 108, the lines L1 and L2 from the DER device 116 may provide voltages having different electrical phases. Further, the connection point for the neutral wire N may also have an electrical connection in a corresponding receptacle of the DER collar 106.

The connection points (e.g., receptacles) included in the DER collar 106 may accommodate insertion of connecting components (e.g., blade connectors) on the DER meter 102 to form electrical connections between the DER collar 106 and the DER meter 102. Similarly, the DER collar 106 may include connection points (e.g., connecting components such as blade connectors) that are received by receptacles in the meter socket 104 and the DER device 116. Other electrical couplings are also contemplated between the meter socket 104, the DER device 116, the DER collar 106, and the DER meter 102. When the connecting components of the DER meter 102 are inserted into the receptacles of the DER collar 106, and when the connecting components of the DER collar 106 are inserted into the receptacles of the meter socket 104 and the DER device 116, electrical connections may be formed between the DER meter 102 and the lines L1 (Line) and L2 (Line) from the grid 108, between the DER meter 102 and the lines L1 and L2 from the DER device 116, and between the DER meter 102 and the lines L1 (Load) and L2 (Load) to the electrical service 110. The connection points and connecting components (e.g., receptacles and blade connectors) may generally be referred to as mating connectors.

In addition, when the connecting components of the DER meter 102 are inserted into the receptacles of the DER collar 106, and when the connecting components of the DER collar 106 are inserted into the receptacles of the meter socket 104 and the DER device 116, an electrical connection may be formed between the neutral wire N and the DER meter 102. The electrical connection of the neutral wire N with the DER collar 106 and the DER meter 102 may provide an electrical reference point to enable voltage measurements from L1 (Line) to neutral and L2 (Line) to neutral at the voltage transducers 112 within the DER meter 102. The ability to perform these voltage measurements at the DER meter 102 may allow for more advanced and higher fidelity metering than is possible with a standard 2S meter form, which only has L1 (Line) and L2 (Line) connections available (i.e., no neutral N connection) and therefore can only measure line to line voltage (i.e., from L1 (Line) to L2 (Line)). The DER meter 102 may also perform current measurements on the L1 (Line) and L2 (Line) lines from the grid 108 using the current transducer 114a, the DER device 116 using the current transducer 114b, and the electrical service 110 using the current transducers 114c and 114d. The ability to perform L1 (Line) to neutral and L2 (Line) to neutral voltage measurements at the DER meter 102 as well as performing the current measurements at the DER meter 102 may enable implementation of various applications such as load disaggregation algorithms.

The lines L1 (Line) and L2 (Line) from the grid 108 may provide line voltages having different electrical phases. The different electrical phases may be generated by a local distribution transformer (e.g., a pole-mounted transformer located near the meter) or may be different electrical phases generated at a substation. Similarly, the lines L1 and L2 from the DER device 116 may provide line voltages having different electrical phases. The electrical phases of the line voltages on the lines L1 and L2 provided by the DER device 116 may be synchronized with the electrical phases of the line voltages on the lines L1 (Line) and L2 (Line) provided by the grid 108. Embodiments of meter sockets and meters in accordance with the present disclosure may include more or fewer connection points or receptacles corresponding to different phases of line voltages. For example, when only one line voltage phase is connected (e.g., phase A) fewer connection points and receptacles may be included in the meter socket since connection points for additional phases (e.g. phase B and phase C) are not needed. Similarly, when three line voltage phases are connected (e.g., phases A, B, and C) additional connection points and receptacles may be included in the meter socket.

In an example, a disconnect switch 122 is included in the DER meter 102. In such an example, the disconnect switch 122 may remain open when the voltage transducers 112a and 112b do not detect a voltage from the grid 108. Further, the disconnect switch may be used as a mechanism to synchronize voltage phases from the DER device 116 with the grid 108. For example, the voltage transducers 112c and 112d may measure the voltage supplied by the DER device 116 while the voltage transducers 112a and 112b measure the voltage supplied by the grid 108 while the disconnect switch 122 is open. Upon reaching synchronization between the DER device 116 and the grid 108 during a synchronization operation, the disconnect switch 122 may close. Further, the disconnect switch 122 may disconnect the DER meter 102 from the L1 (Line) and L2 (Line) connections to the grid 108. The ability to disconnect the DER meter 102 from the grid 108 may enable "islanding," (i.e., disconnecting from the grid 108 and supplying power to the electrical service 110 only from the DER device 116).

The DER collar 106 may include an integrated controllable electrical disconnect switch 124, a circuit breaker 126, or both, that disconnect or protect the DER device 116. For example, a single device may perform both functions of a circuit breaker and a separate electrical disconnect device to disconnect the lines L1 and L2 of the DER device 116 from the DER meter 102. Alternatively, the controllable electrical disconnect switch 124, the circuit breaker 126, or both may be located external to the DER collar 106 (e.g., on an outside of the DER collar 106) while maintaining the mechanical connections through the DER meter 102 and DER collar 106 as described above. In an example, the circuit breaker 126 may disconnect the DER device 116 from the DER meter 102 upon occurrence of an electrical fault.

The controllable electrical disconnect switch 124 may include a processor (not shown) and a communications module (not shown). The controllable electrical disconnect switch 124 may operate automatically to disconnect the DER device 116 from the grid 108, for example, when a high load is detected or when the electrical service or load 110 is disconnected from the meter. In some examples, the controllable electrical disconnect switch 124 may operate automatically to disconnect the DER device 116 from the grid 108 based on a command received from the DER meter 102 or another device. The controllable electrical disconnect switch 124 may enable connecting the DER device 116 to the DER meter 102 to measure power production or consumption of the DER device 116 as a separate value to the energy consumed from or sent back to the electric distribution system (i.e., the grid 108) thereby providing billable data. The billable data (i.e., consumption from the grid 108 or production fed back to the grid 108) may be metered within the electricity meter using "net metering" or similar methods. Further, the controllable electrical disconnect switch 124 may connect or disconnect the DER device 116 from the grid 108 based on power production or consumption requirements of the grid 108 and the DER device 116. Moreover, the disconnect switch 124 may be used to electrically disconnect the DER device 116 from a DER meter side of the DER collar 106 to enable a technician to repair the DER meter 102, install the DER meter 102, or to replace the DER meter 102.

The DER meter 102 may measure and control the electricity delivered to the electrical service 110 via the grid 108, the DER device 116, or both. The DER meter 102 may include a communications module (not shown) and a processor (not shown). The processor may be a microprocessor; however, embodiments in accordance with the present disclosure are not limited to such an implementation. For example, the processor may be a microprocessor, microcomputer, computer, microcontroller, programmable controller, or other programmable device. One of ordinary skill in the art will appreciate that other variations may be implemented without departing from the scope of the present disclosure.

The communications module may communicate via RF, cellular, PLC, or any other suitable communications technology. The communications module may receive communications via a network that include instructions for controlling the controllable electrical disconnect switch. The communications module may transmit information related to the operation of the meter and the measurements performed by the measurement devices in the meter to other devices on the network or a to central system.

In accordance with various aspects of the present disclosure, where the DER device 116 includes some form of electricity generator (e.g., solar or wind electricity generation) or a storage device, the meter may use information about the electric distribution system. The information may include real-time electricity pricing or other information to make decisions and to control the DER device 116. For example, the DER meter 102 may use information to determine whether the DER device 116 should send energy to the grid 108 (e.g., from solar or battery storage, where battery storage could include batteries within an electric vehicle or similar), whether the DER device 116 should consume energy from the grid 108 (e.g., to charge storage or allow large loads such as water heaters, pool pumps, etc. to run), whether the DER device 116 should disconnect from the grid 108 (e.g., not consume energy from the grid 108 or send energy to the grid 108), or any combination thereof. Appropriate control actions may be initiated by the DER meter 102 based on the determination. One or ordinary skill in the art will appreciate that the above examples of decisions and control are not exhaustive and that other decisions and control operations may be performed without departing from the scope of the present disclosure.

Figure 2:
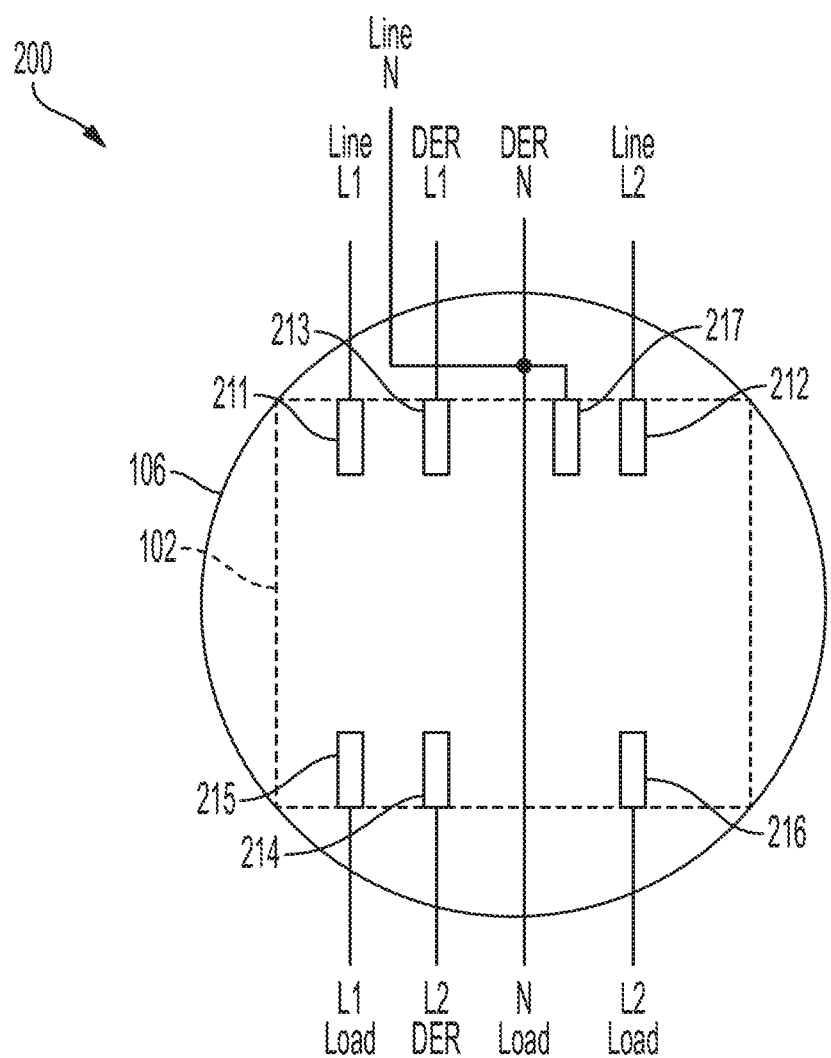
FIG. 2 is a diagram of electrical connections of the DER collar of FIG. 1 for connecting with a DER meter according to various aspects of the present disclosure.

FIG. 2 is a diagram 200 of electrical connections of the DER collar 102 for connecting with the DER meter 102 in accordance with various aspects of the present disclosure. The DER collar 106 may include a plurality of receptacles 211-217 or other mating connectors, for example, seven or another number of receptacles. The number of receptacles 211-217 of the DER collar 106 may correspond to a number of mating connectors on the DER meter 102. In accordance with various aspects of the present disclosure, the DER collar 106 and the DER meter 102 having seven or more receptacles/connectors may be suitable for implementing load disaggregation algorithms with an appropriate number of voltage transducers 112 and current transducers 114 included in the DER meter 102. For example, current transducers 114a and 114b are positioned to individually measure current originating from the grid 108 and the DER device 116, respectively. In combination with the voltage transducers 112, the DER meter 102 is able to accurately allot power consumption by the electrical service 110 to appropriate sources (e.g., the grid 108 or the DER device 116).

First and second receptacles 211 and 212 may provide electrical connections to the DER meter 102 for lines L1 (Line) and L2 (Line) from the grid (e.g., the grid 108). Third and fourth receptacles 213 and 214, may provide electrical connections to the DER meter 102 for lines L1 and L2 from the DER device (e.g., the DER device 116). Fifth and sixth receptacles 215 and 216 may provide electrical connections to the electrical service (e.g., the electrical service 110) for lines L1 (Load) and L2 (Load) from the DER meter 102. Seventh receptacle 217 may provide an electrical connection from the neutral wire N in the DER collar 106 to the DER meter 102. Providing a connection of the neutral wire into the DER meter 102 may enable the measurement devices (e.g., the voltage transducers 112, the current transducers 114, or other measurement devices) contained in the DER meter 102 to perform voltage measurements at the DER meter 102 on the lines L1 (Line) and L2 (Line) from the grid 108 and the lines L1 and L2 from the DER device 116 to determine power provided or consumed by the grid 108 and the DER device 116. For example, the neutral wire N enables direct measurements from line L1 to neutral and from line L2 to neutral rather than taking a single measurement from line L1 to line L2. Since the voltage waveforms on lines L1 and L2 are theoretically 180° out of phase with each other, these voltage measurements from line L1 to neutral and line L2 to neutral are added together. During instances where the phases do not align perfectly, or where the voltage from line L1 to neutral is not identical to the voltage from line L2 to neutral due to a specific load only being present on one of the lines L1 or L2, the measurements from line L1 to neutral and line L2 to neutral provide enhanced accuracy and fidelity over measurements only from line L1 to line L2.

While FIGS. 1 and 2 illustrate the DER collar 106 and the DER meter 102 having seven connections, embodiments in accordance with the present disclosure are not limited to this implementation. For example, some implementations of the DER collar 106 and the DER meter 102 may include a different number of connnections (e.g., more or fewer than seven connections) without departing from the scope of the present disclosure.

In accordance with various aspects of the present disclosure, methods similar to those described above may be employed to add DER device switching and measurement capability to a meter socket having ANSI 1S, 2S, 3S, 4S, 5S, or 12S meter forms or any other meter forms.

Figure 3:
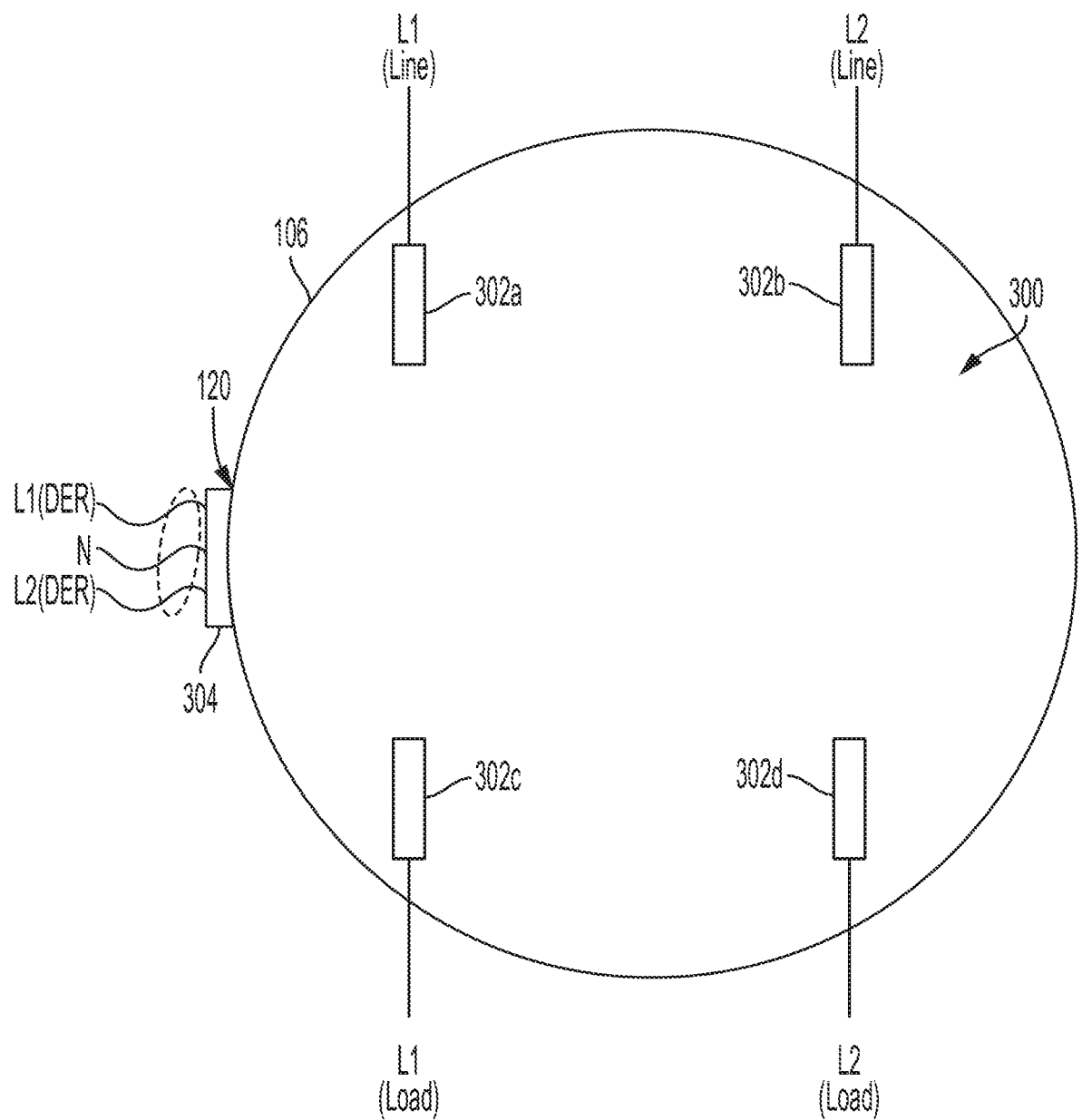
FIG. 3 is a diagram illustrating the DER collar of FIG. 1 in an orientation facing an ANSI standard 2S meter form socket according to various aspects of the present disclosure.

An ANSI standard 2S form meter socket and meter are installed at most US residences. FIG. 3 is a diagram illustrating the DER collar 106 in an orientation facing an ANSI standard 2S meter form socket (e.g., the meter socket 104) according to various aspects of the present disclosure. That is, FIG. 3 depicts a side of the DER collar 106 that attaches to the meter socket 104. As illustrated, the 2S form facing side 300 of the DER collar 106 provides only four receptacles 302a-302d or other mating connectors for electrical connections between the lines L1 (Line) and L2 (Line) (i.e., the lines from the grid 108) and the lines L1 (Load) and L2 (Load) (i.e., the lines to the electrical service 110) within the meter socket 104 to the DER meter 102. The DER collar 106 may include an additional receptacle 304 on the side 120 of the DER collar 106 for connecting the lines L1 and L2 of the DER device 116 as well as the neutral wire N to the DER meter 102.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. An electric meter collar, comprising:
   at least one first connection path within the electric meter collar configured to form an electrical connection between a distributed energy resource (DER) meter and line voltage wirings in a socket of an electric distribution system;
   at least one second connection path within the electric meter collar configured to form an electrical connection between the DER meter and neutral wires of the electric distribution system, a DER device, and a load;

at least one third connection path within the electric meter collar configured to form an electrical connection between the DER meter and output voltage wirings of the DER device;

a first plurality of mating connectors comprising:
  a first mating connector electrically connected to a first end of the at least one first connection path and configured to accept a first electrical meter mating connector of the DER meter;
  a second mating connector electrically connected to the first end of the at least one second connection path and configured to accept a second electrical meter mating connector of the DER meter; and
  a third mating connector electrically connected to the first end of the at least one third connection path and configured to accept a third electrical meter mating connector of the DER meter; and a second plurality of mating connectors, each of the second plurality of mating connectors electrically connected to a second end of the at least one first connection path, the at least one second connection path, or the at least one third connection path and configured to mate with the line voltage wirings, the neutral wires, and the output voltage wirings.

2. The electric meter collar of claim 1, further comprising:
at least one fourth connection path within the electric meter collar configured to form an electrical connection between the DER meter and the load.

3. The electric meter collar of claim 1, wherein the at least one first connection path comprises a plurality of first connection paths, and wherein each connection path of the plurality of first connection paths corresponds to line voltage wirings of the electric distribution system with voltages having different electrical phases.

4. The electric meter collar of claim 1, further comprising:
a controllable electrical disconnect switch configured to connect and disconnect the DER device from the electric distribution system based on power production or consumption requirements of the electric distribution system and the DER device.

5. The electric meter collar of claim 4, wherein the controllable electrical disconnect switch is configured to connect and disconnect the DER device from the electric distribution system based on a command received from the DER meter.

6. The electric meter collar of claim 1, further comprising:
a circuit breaker connected between the output voltage wirings of the DER device and corresponding mating connectors of the electric meter collar, wherein the circuit breaker is configured to disconnect the DER device from the electric distribution system on an occurrence of an electrical fault.

7. A system, comprising:
an electric meter; and
an electric meter collar configured to mate with the electric meter, wherein the electric meter collar comprises:
  at least one first connection path within the electric meter collar configured to form an electrical connection between the electric meter and line voltage wirings in a socket of an electric distribution system;
  at least one second connection path within the electric meter collar configured to form an electrical connection between the electric meter and neutral wires in the socket of the electric distribution system;
  at least one third connection path within the electric meter collar configured to form an electrical connection between the electric meter and output voltage wirings of a distributed energy resource (DER) device;
  a first plurality of mating connectors comprising:
    a first mating connector electrically connected to a first end of the at least one first connection path and configured to accept a first electrical meter mating connector of the electrical meter;
    a second mating connector electrically connected to the first end of the at least one second connection path and configured to accept a second electrical meter mating connector of the electrical meter; and
    a third mating connector electrically connected to the first end of the at least one third connection path and configured to accept a third electrical meter mating connector of the electrical meter; and
  a second plurality of mating connectors, each of the second plurality of mating connectors electrically connected to a second end of the at least one first connection path, the at least one second connection path, or the at least one third connection path and configured to mate with the line voltage wirings, the neutral wires, or the output voltage wirings.

8. The system of claim 7, wherein the electric meter comprises a plurality of voltage measurement devices and a plurality of current measurement devices, wherein the plurality of voltage measurement devices and current measurements devices are configured to measure electrical characteristics of voltage and current waveforms provided to a load, and wherein the neutral wires provide a reference point for measurement of the voltage waveforms.

9. The system of claim 8, wherein the plurality of voltage measurement devices comprises a plurality of voltage transducers,
wherein each of the plurality of voltage transducers is configured to individually measure voltage characteristics of one of a plurality of line voltages provided from the electric distribution system or an output voltage provided by the DER device,
wherein each of the plurality of line voltages provided from the electric distribution system has a different electrical phase, and
wherein measurements of the voltage characteristics are performed between line voltage wirings of the electric distribution system and the neutral wires.

10. The system of claim 8, wherein the plurality of current measurement devices comprises a plurality of current transducers, and
wherein the plurality of current transducers is configured to individually measure current consumed by a load on each line voltage wiring connected to the load and current provided by the line voltage wirings of the electric distribution system and output voltage wirings of the DER device.

11. A system for connecting and metering distributed energy resource devices, the system comprising:
an electric meter;
an electric meter socket electrically coupled to an electric distribution system; and
an electric meter collar configured to electrically couple the electric meter with the electric meter socket, wherein the electric meter collar comprises:
  at least one first connection path within the electric meter collar configured to form electrical connections between the electric meter and line voltage wirings in the electric meter socket;

at least one second connection path within the electric meter collar configured to form an electrical connection between the electric meter and neutral wires of the electric distribution system, a distributed energy resource (DER) device, and a load;

at least one third connection path within the electric meter collar configured to form electrical connections between the electric meter and output voltage wirings of the DER device;

at least one fourth connection path within the electric meter collar configured to form an electrical connection between the electric meter and the load;

a first plurality of mating connectors comprising:
  a first mating connector electrically connected to a first end of the at least one first connection path and configured to accept a first electrical meter mating connector of the electrical meter;
  a second mating connector electrically connected to the first end of the at least one second connection path and configured to accept a second electrical meter mating connector of the electrical meter;
  a third mating connector electrically connected to the first end of the at least one third connection path and configured to accept a third electrical meter mating connector of the electrical meter; and
  a fourth mating connector electrically connected to the first end of the at least one fourth connection path and configured to accept a fourth electrical meter mating connector of the electrical meter; and a second plurality of mating connectors, each of the second plurality of mating connectors electrically connected to a second end of the at least one first connection path, the at least one second connection path, or the at least one third connection path and configured to mate with the line voltage wirings, the neutral wires, the output voltage wirings, or the load.

12. The system of claim 11, wherein a DER device mating connector of the second plurality of mating connectors is positioned on an exposed side of the electric meter collar while the electric meter collar is coupled to the electric meter and the electric meter socket.

13. The system of claim 11, wherein the at least one first connection path comprises a first plurality of connection paths, and wherein each of the first plurality of connection paths corresponds to additional line voltage wirings of the electric distribution system with voltages having different electrical phases.

14. The system of claim 11, wherein the electric meter collar further comprises:
  a controllable electrical disconnect switch configured to connect and disconnect the DER device from the electric distribution system based on power production or consumption requirements of the electric distribution system and the DER device.

15. The system of claim 14, wherein the controllable electrical disconnect switch is configured to connect and disconnect the DER device from the electric distribution system based on a command received from the electric meter.

16. The system of claim 11, wherein the electric meter collar further comprises:
  a circuit breaker connected between the output voltage wirings of the DER device and the electric meter, wherein the circuit breaker is configured to disconnect the DER device from the electric distribution system on an occurrence of an electrical fault.

17. The system of claim 11, wherein the electric meter comprises:
  a plurality of connectors configured to form electrical connections to the first plurality of mating connectors, wherein at least one electrical connection to the first plurality of mating connectors is formed with the neutral wires; and
  a plurality of measurement devices configured to measure electrical characteristics of voltage and current waveforms provided to the electric meter from the electric distribution system and the DER device, wherein the neutral wires provide an electrical reference point for measurement of the voltage waveforms.

18. The system of claim 17, wherein the plurality of measurement devices comprises measurement devices configured to measure electrical characteristics of voltage and current waveforms provided to the load, and wherein the neutral wires provide a reference point for measurement of the voltage waveforms.

19. The system of claim 17, wherein the plurality of measurement devices comprises a plurality of voltage transducers,
  wherein each of the plurality of voltage transducers is configured to individually measure voltage characteristics of one of a plurality of line voltages provided from the electric distribution system or output voltage provided by the DER device,
  wherein each of a plurality of line voltages provided from the electric distribution system has a different electrical phase, and
  wherein measurements of the voltage characteristics are performed between the line voltage wirings of the electric distribution system and the neutral wires.

20. The system of claim 17, wherein the plurality of measurement devices comprises a plurality of current transducers, and wherein the plurality of current transducers is configured to individually measure (i) current consumed by the load on each of the line voltage wirings connected to the load and (ii) current provided by the line voltage wirings of the electric distribution system and the output voltage wirings of the DER device.

* * * * *